United States Patent
Toda et al.

(10) Patent No.: US 11,939,497 B2
(45) Date of Patent: Mar. 26, 2024

(54) SILICONE-BASED ADHESIVE SHEET, MULTILAYER STRUCTURE INCLUDING SAME, AND METHOD FOR PRODUCING SEMICONDUCTOR DEVICE

(71) Applicant: DOW TORAY CO., LTD., Tokyo (JP)

(72) Inventors: Nohno Toda, Ichihara (JP); Manabu Sutoh, Ichihara (JP)

(73) Assignee: DOW TORAY CO., LTD., Tokyo (JP)

( * ) Notice: Subject to any disclaimer, the term of this patent is extended or adjusted under 35 U.S.C. 154(b) by 685 days.

(21) Appl. No.: 16/955,209

(22) PCT Filed: Dec. 19, 2018

(86) PCT No.: PCT/JP2018/046702
§ 371 (c)(1),
(2) Date: Jun. 18, 2020

(87) PCT Pub. No.: WO2019/124417
PCT Pub. Date: Jun. 27, 2019

(65) Prior Publication Data
US 2020/0339848 A1 Oct. 29, 2020

(30) Foreign Application Priority Data
Dec. 20, 2017 (JP) ................................. 2017-243335

(51) Int. Cl.
| | |
|---|---|
| C09J 183/04 | (2006.01) |
| B32B 27/08 | (2006.01) |
| B32B 27/28 | (2006.01) |
| C08G 77/12 | (2006.01) |
| C08G 77/20 | (2006.01) |
| C09J 7/35 | (2018.01) |
| C09J 11/06 | (2006.01) |
| H01L 21/683 | (2006.01) |
| H01L 21/78 | (2006.01) |

(52) U.S. Cl.
CPC ............ *C09J 183/04* (2013.01); *B32B 27/08* (2013.01); *B32B 27/285* (2013.01); *B32B 27/286* (2013.01); *C08G 77/12* (2013.01); *C08G 77/20* (2013.01); *C09J 7/35* (2018.01); *C09J 11/06* (2013.01); *H01L 21/6836* (2013.01); *H01L 21/78* (2013.01); *B32B 2457/14* (2013.01); *C09J 2203/326* (2013.01); *C09J 2483/00* (2013.01); *H01L 2221/68327* (2013.01)

(58) Field of Classification Search
CPC ...... C09J 183/04; C09J 7/35; C09J 2203/326; C09J 2483/00; B32B 27/08; C08G 77/12; C08G 77/20; C08G 77/14; H01L 21/6836; H01L 2221/68327; B81C 3/001; C08L 83/04
See application file for complete search history.

(56) References Cited

U.S. PATENT DOCUMENTS

| | | | |
|---|---|---|---|
| 5,021,494 A * | 6/1991 | Toya | ................ C08K 5/54 524/404 |
| 6,235,862 B1 | 5/2001 | Isshiki et al. | |
| 2003/0129347 A1 | 7/2003 | Yamakawa et al. | |
| 2007/0166500 A1 | 7/2007 | Sutoh et al. | |
| 2020/0347229 A1 | 11/2020 | Fujisawa et al. | |

FOREIGN PATENT DOCUMENTS

| | | | | |
|---|---|---|---|---|
| EP | 3130643 A1 | 2/2017 | | |
| JP | H1112546 A | 1/1999 | | |
| JP | 200080335 A | 3/2000 | | |
| JP | 2005183855 A | 7/2005 | | |
| JP | 2012169573 A | 9/2012 | | |
| JP | 2015050216 A | 3/2015 | | |
| WO | 2018043270 A1 | 3/2018 | | |
| WO | WO-2018132941 A1 * | 7/2018 | ............. | C08G 77/16 |

OTHER PUBLICATIONS

Krishnan Premila et al., "Die attach film (DAF) for Breakthrough in Manufacturing (BIM) application", 36th International Electronics Manufacturing Technology Conference, IEEE, Nov. 11, 2014, pp. 1-3.
International Search Report for PCT/JP2018/046702 dated Feb. 19, 2019, 1 page.
Machine assisted English translation of JP2000080335A obtained from https://patents.google.com/patent on Sep. 17, 2020, 14 pages.
Machine assisted English translation of JP2012169573A obtained from https://patents.google.com/patent on Sep. 17, 2020, 12 pages.
Machine assisted English translation of JP2015050216A obtained from https://patents.google.com/patent on Sep. 17, 2020, 12 pages.

* cited by examiner

*Primary Examiner* — Scott R. Walshon
(74) *Attorney, Agent, or Firm* — Warner Norcross + Judd LLP

(57) ABSTRACT

Provided is: a layered body wherein a sheet surface has slight adhesiveness, enabling easy temporary securing of a semiconductor chip, or the like, that has been diced, onto a semiconductor substrate, and wherein permanent adhesion to an adhered object is expressed through post-curing; a layered body that includes the same; a semiconductor device that uses the same; and a method for manufacturing the semiconductor device. A silicone-based adhesive sheet is disclosed herein, wherein, prior to heating, the delamination mode of the adhesive surface from a non-adhesive substrate is interfacial delamination, and after heating of the adhesive surface in a range of between 50 and 200° C., the delamination mode of the adhesive surface from another non-adhesive substrate changes to cohesive fracturing, and exhibits permanent adhesion.

18 Claims, No Drawings

SILICONE-BASED ADHESIVE SHEET, MULTILAYER STRUCTURE INCLUDING SAME, AND METHOD FOR PRODUCING SEMICONDUCTOR DEVICE

CROSS-REFERENCE TO RELATED APPLICATIONS

This application is the National Stage of International Appl. No. PCT/JP2018/046702 filed on 19 Dec. 2018, which claims priority to and all advantages of Japanese Appl. No. 2017-243335 filed on 20 Dec. 2017, the content of which is hereby incorporated by reference.

FIELD OF TECHNOLOGY

The present invention relates to a silicone-based adhesive sheet that, due to its surface being slightly adhesive, can temporarily secure diced semiconductor chips, or the like, easily onto a semiconductor substrate, and that expresses permanent adhesion onto an adhered object through post-curing, relates to a layered body that includes the same, and relates to a method for manufacturing a semiconductor device (including MEMS devices in particular) using the same.

PRIOR ART

A semiconductor device of silicon, or the like, that becomes a semiconductor device through: a step for forming a plurality of electronic circuits on the surface of a semiconductor wafer; a step for polishing the back face of the semiconductor wafer on which the electronic circuits have been formed; a step for dividing the semiconductor wafer into IC chips having individual electronics circuits through cutting (dicing) in a state wherein the semiconductor wafer is secured to a base film; a step for securing (die bonding) the IC chips to die pads; and, arbitrarily, a step for sealing the chips in resin. Here, in the step for securing to the die pad an IC chip that has been obtained through cutting the semiconductor wafer, the chip is secured through an adhesive agent to the die pad (a mounting portion). If the adhesive agent is a liquid, the adhesive agent is drip-coated onto the surface of the chip mounting portion or of the chip itself, but when a liquid adhesive agent is dripped in this way it is difficult to control the amount of the adhesive agent accurately, and if the chip is small, the adhesive agent may extend beyond the chip, and if the chip is large, the adhesive agent may be inadequate, and thus a method is used wherein the IC chip is secured to the die pad using a sheet-shaped adhesive agent of a dry type, wherein the thickness has been caused to be uniform in advance.

For example, the applicant in the present case has proposed that which is disclosed in Patent Document 1 and Patent Document 2 as silicone-based adhesive sheets. Moreover, for the purpose of improving the labor and cost involved in manufacturing semiconductor devices, the applicant has proposed the dicing die bonding sheet of Patent Document 3. These silicone-based semiconductor sheets are well suited for the purpose of adhering a semiconductor chip or a wafer for a semiconductor to an attaching portion through heating (permanent bonding for the purpose of affixing), and, in a dicing step prior to the die bonding step, the adhesive agent layer is supplied in advance to the semiconductor wafer surface in a stage wherein the semiconductor wafer is secured on a base film, making it possible to form a chip that has an adhesive agent layer that corresponds accurately to the shape of the chip surface, thus providing superior ease of handling at the time of die bonding, superior manufacturing efficiency of semiconductor devices, and so forth.

On the other hand, in the field of semiconductor devices, MEMS devices such as miniaturized and highly integrated sensors, and the like, that use MEMS (micro electro mechanical systems) technology are becoming more popular, and when compared to that which is conventional, there have been advancements in ultra-miniaturization and weight reduction of semiconductor chips that are produced through dicing, and in miniaturization of semiconductor packages, and there is the need for high precision structures for arranging a large number of semiconductor chips within a single package.

However, when the conventional silicone-based adhesive sheet is used in such an ultra-miniaturized MEMS device, the positions of the semiconductor chips on the die pads may become misaligned due to vibrations that occur between placing of the semiconductor chips, which are equipped with the adhesive sheet layers, on the die pads, and the die bonding step. In particular, in an MEMS device, many semiconductor chips are placed sequentially within the same package, making it is difficult to fully prevent such vibrations, and thus it becomes necessary to check the arrangement of the chips after placement, or to perform readjustments, so there is a problem with reduced yield and manufacturing efficiency.

The problem with the misalignment caused by vibration can be solved through permanent adhesion of the individual chips, which are equipped with adhesive sheets, and then performing thermal bonding (pressing and heating) (=thermal bonding adhesion). However, in this step it would require thermal bonding operations for at least several seconds for each individual chip, which would cause a substantial reduction in manufacturing efficiency of MEMS devices that are provided with large numbers of semiconductor chips, and also the bonding operations might damage the devices themselves. In addition, removal of a semiconductor chip, once secured, would be difficult, which would have a negative effect on reusability and repairability of devices. Because of this, the industrial use of known silicone-based adhesive sheets is limited, particularly in manufacturing of MEMS devices.

PRIOR ART DOCUMENTS

Patent Documents

Japanese Unexamined Patent Application Publication H11-12546 (Japanese Patent 3420473)
Japanese Unexamined Patent Application Publication 2000-80335 (Japanese Patent 3420510)
Japanese Unexamined Patent Application Publication 2005-183855 (Japanese Patent 4536367)

SUMMARY OF THE INVENTION

Problem Solved by the Present Invention

The object of the present invention is to provide a silicone-based adhesive sheet that is suitable for use in manufacturing a small semiconductor device that includes an MEMS device, and to improve the manufacturing efficiency and yield thereof. Moreover, it is to provide a layered body that includes a silicone-based adhesive sheet, and to provide the use thereof as a die attaching film for a semiconductor chip or a wafer for a semiconductor, and use as a semiconductor device precursor. Moreover, it is to provide a semiconductor device (and particularly an MEMS device) that has a structure wherein a semiconductor chip or a wafer for a semiconductor is secured onto a substrate through a cured material of the silicone-based adhesive sheet, and to provide a manufacturing method thereof.

Means for Solving the Problem

As the result of earnest research, the present inventors arrived at the present invention through discovering that the problem described above can be solved through a silicone-based adhesive sheet wherein the surface has an appropriate slight adhesion at a stage prior to expressing permanent adhesion to the adhered object through heating. Specifically, the problem described above is solved through a silicone-based adhesive sheet wherein, prior to heating, the delamination mode for delamination of the adhesive surface and another non-adhesive substrate is interfacial delamination, where after the adhesive surface has been heated in a range between 50 and 200° C., the delamination mode of the adhesive surface from the other non-adhesive substrate changes to that of cohesive fracturing, exhibiting permanent adhesion. Preferably the silicone-based adhesive sheet exhibits interfacial delamination of the adhesive sheet from a probe, and exhibits a maximum value for the adhesive strength, when a stainless steel probe with a diameter of 8 mm is lowered with the speed of 0.01 mm/s, in respect to the sheet surface, for any of the surfaces of the sheet, using a texture analyzer, to apply a load of 50 gf, which is held for 0.5 seconds, followed by raising the probe at a speed of 0.5 mm/s, where after the surface that has exhibited this maximum value for the adhesive strength is heated for three hours at between 100 and 200° C., the mode of delamination of the adhesive surface from another non-adhesive substrate changes to that of cohesive fracturing. Here the adhered object preferably is a chip, a wafer, a lead frame, a resin substrate, a ceramic substrate, a layered chip, or another member for a semiconductor.

In the silicone-based adhesive sheet described above, having a maximum value for the adhesive strength when a prescribed pressure is applied to the probe with the 8 mm diameter followed by raising with the prescribed speed, described above, refers to the sheet surface being slightly adhesive, suitable for temporarily holding and provisionally securing the chip, or the like, on the substrate. The maximal value of the adhesive strength of the silicone-based adhesive sheet according to the present embodiment may be a value of 10 gf or more, or a value of 15 gf or more. Moreover, the silicone-based adhesive sheet preferably has a sheet thickness in a range of between 5 and 1000 μm.

The silicone-based adhesive sheet is held between substrates that have releaseability in respect to the sheet. Moreover, preferably at least one of the substrates has an oxygen atom or a sulfur atom in the surface that contacts the sheet. Such a silicone-based adhesive sheet is a cross-linked material of a cross-linkable silicone composition, where the composition is caused to undergo cross-linking between substrates that have releaseability in respect to the cross-linked material, where preferably at least one substrate has an oxygen atom or a sulfur atom on the surface that contacts the composition, and additionally, preferably the substrate is a sheet-shaped substrate made from an organic resin, where the oxygen atom is an atom that structures a group selected from a set comprising carbonyl groups, alkoxy groups, ester groups, and ether groups, where the sulfur atom preferably is an atom that structures a group selected from a set comprising sulfone groups and thioether groups.

Preferably these adhesive sheets are a cross-linked material of a cross-linkable silicone composition of: (A) organopolysiloxane having at least two silicon atom-bonded alkenyl groups in a single molecule; (B) an organopolysiloxane having at least two silicon atom-bonded hydrogen atoms in a single molecule; (C) at least one type of adhesion promoting agent; and (D) a catalyst for a hydrosilylation reaction. Moreover, at least one surface of the sheet preferably expresses permanent adhesion in respect to an adhered object that is in contact, through heating for three hours in a range between 100 and 200° C.

Preferably these adhesive sheets are used for the purpose of bonding a semiconductor chip or a wafer for a semiconductor to an attaching portion, and, particularly, for a die attach film application used in an MEMS device.

Moreover, the object of the present invention is achieved through a layered body that includes the silicone-based adhesive sheet described above.

One ideal layered body is a sheet-shaped layered body wherein the silicone-based adhesive sheet set forth above is held between substrates that have releaseability in respect to said sheet, and wherein at least one substrate has an oxygen atom or a sulfur atom in the surface that contacts the sheet, and preferably is a die attach film for a semiconductor chip or a wafer for a semiconductor.

Another ideal layered body is a layered body that is a precursor for a semiconductor device, having a structure wherein a semiconductor chip or a wafer for a semiconductor is disposed with an interposed silicone-based adhesive sheet. The layered body may be a precursor to a semiconductor device having a structure wherein a semiconductor chip (die), which has been formed into an individual piece through dicing, is disposed on a die pad with the silicone-based adhesive sheet, described above, interposed therebetween, so as to be held temporarily (secured temporarily), and, in particular, may be a precursor for an MEMS device. This makes it possible to produce a semiconductor device (preferably an MEMS device) that has a structure wherein the semiconductor chip or wafer for a semiconductor is secured on a substrate through curing the silicone-based adhesive sheet, described above, through heating the layered body as a whole in a range of between 50 and 200° C.

Moreover, the silicone-based adhesive sheet according to the present invention is well suited to manufacturing a semiconductor device (and, in particular, an MEMS device), and is used in a method for manufacturing a semiconductor device having the following steps:

Step 1: A step for layering the silicone-based adhesive sheet, described above, on the back face of a wafer for a semiconductor;

Step 2: A step for forming individual pieces through dicing the layered body obtained in Step 1, above;

Step 3: A step for arranging, on a semiconductor substrate, with the surface of the silicone-based adhesive sheet interposed therebetween, the pieces of the wafer for the semiconductor, obtained in Step 2, above; and Step 4: A step for heating, in a range of between 50 and 200° C., the structural unit wherein the individual pieces of the wafer for the semiconductor are disposed on the semiconductor substrate, with the surface of the silicone-based adhesive sheet interposed therebetween, to bond the pieces of the wafer for the semiconductor onto the top of the semiconductor substrate through the silicone-based adhesive sheet.

Moreover, the silicone-based adhesive sheet according to the present invention is used in a method for manufacturing a semiconductor device (and especially an MEMS device) having the following steps:

Step 1: A step for dividing the silicone-based adhesive sheet, described above, into individual pieces of a size that approximates that of a semiconductor chip;

Step 2: A step for disposing, on a semiconductor substrate, the silicone-based adhesive sheet that has been divided into individual pieces in Step 1, above;

Step 3: A step for disposing a semiconductor chip onto the silicone-based adhesive sheet that has been divided into individual pieces, disposed on the semiconductor substrate in Step 2, above; and Step 4: A step for heating, in a range of between 50 and 200° C., the structural unit, obtained in Step 3, wherein a semiconductor chip is disposed on the semiconductor substrate, with the surface of the silicone-based adhesive sheet interposed therebetween, to bond the semiconductor chip onto the top of the semiconductor substrate through the silicone-based adhesive sheet.

Effects of the Invention

The present invention makes it possible to produce a silicone-based adhesive sheet with improved manufacturing efficiency and yield, and which is well suited to manufacturing of small semiconductor devices, including MEMS devices. Moreover, this enables use, as a semiconductor device precursor, of a layered body that includes the silicone-based adhesive sheet, as a die attach film for a semiconductor chip or for a wafer for a semiconductor. Additionally, this makes it possible to provide a semiconductor device (and, if in particular, an MEMS device), and a manufacturing method thereof, that has a structure wherein a semiconductor chip or a wafer for a semiconductor is secured onto a substrate through a cured material of the silicone-based adhesive sheet that is described above.

Note that the silicone-based adhesive sheet itself according to the present invention possesses adequate adhesion to enable the semiconductor chip, or the like, to be held temporarily, in respect to vibrations, or the like, to temporarily secure to the substrate, without passing through the step for thermal bonding, so that, if prior to die bonding, it will be possible to reposition the chip without producing permanent bonding, such as with cohesive fracturing. Because of this, if a semiconductor chip (including a chip that has been formed into an individual piece through dicing), equipped with the adhesive sheet described above, is disposed on a substrate for a semiconductor, there will be less of a tendency for the chips to become misaligned, or for there to be problems with the chips falling off, and, if desired, it will be possible to peel the chips off for repositioning, without problems such as residual paste, enabling a remarkable improvement in manufacturing efficiency for small semiconductor devices, including MEMS devices.

Forms for Carrying Out the Present Invention

[Silicone-Based Adhesive Sheet]

The silicone-based adhesive sheet according to the present invention expresses permanent adhesion to an adhered object through heating, or the like, thereof after adhesion to the adhered object. Here "permanent adhesion" is an adhesive state wherein, if the silicone-based adhesive sheet, or hardened material thereof (including a post-cured hardened material obtained through heating) were delaminated from the adhered object, the delaminating mode would be that wherein cohesive fracturing would occur in substantially all of the adhesive layer that is the silicone-based adhesive sheet or the hardened material thereof, with residue on the adhered object. Note that here the "substantially the entirety of the adhesive surface" means that cohesive fracturing occurs in a range of at least half (no less than 50%) of the entirety, and may be that cohesive fracturing of the adhesive layer occurs in what may be called a "blotchy pattern."

The expression of permanent adhesion, if the silicone-based adhesive sheet according to the present invention is heated for three hours in a range of between 100 and 200° C., may also be through a selection of a temperature of 100° C. or less, and a heating time of 3 hours or less. Specifically, when the silicone-based adhesive sheet according to the present invention is used in manufacturing a semiconductor device, heating in a range of between 50 and 200° C., or between 50 and 150° C., is suitable. Moreover, while the heating time can be selected as appropriate depending on the size of the semiconductor device, the scope of the heating apparatus (oven or die attach press), or the like, being in a range between several seconds and several hours is preferred from the perspective of manufacturing efficiency. Moreover, if desired, exposure to a high energy beam, such as ultraviolet radiation, or the like, may be combined for the purpose of rapid adhesive bonding at low temperature, or reducing the adhesive bonding time. Note that bonding at a high temperature of 200° C. or more would be undesirable as a condition for achieving the permanent adhesion because it could cause malfunctions in small semiconductor devices, such as MEMS, and the like, in particular.

The silicone-based adhesive sheet according to the present invention has an appropriate slight adhesiveness on the surface sheet surface in the stage prior to expressing permanent adhesion to the adhered object through the heating, or the like, described above, where, specifically, the delaminating mode when disposed on the adhered object is the interface delaminating mode, meaning that the adhesive layer itself is not damaged during delamination, but rather the adhesive layer is substantially completely released, except for a trace amount that is transferred. The known silicone-based adhesive sheets, disclosed in Patent Document 1, and the like, either do not have slight adhesiveness, or the magnitudes thereof are too little or too much, and, in particular, are unsuitable for use in manufacturing of small semiconductor devices, including MEMS devices. In particular, when the silicone-based adhesive sheet does not have slight adhesiveness, positioning or repositioning when positioning semiconductor chips used in MEMS devices would be difficult, and the point that it is possible to cause the sheet to have permanent adhesion after passing through the placement step, which requires the slight adhesiveness, in the semiconductor manufacturing process is an essential distinctive feature of the silicone-based adhesive sheet according to the present invention.

More specifically, the silicone-based adhesive sheet according to the present invention is a silicone-based adhesive sheet wherein, in the delamination mode, prior to heating, of the adhesive surface from another non-adhesive substrate is that of interfacial delamination, and after heating the adhesive surface in a range of between 50 and 200° C., the delamination mode for delamination of the adhesive surface from another substrate that is non-adhesive, changes to cohesive fracturing, exhibiting permanent adhesion. Note that here the "non-adhesive substrate" means a substrate that, itself, does not exhibit adhesiveness, such as a semiconductor chip, a semiconductor wafer, a lead frame, a resin substrate, a ceramic substrate, a layered semiconductor chip, a stainless steel plate, or the like.

Such a silicone adhesive sheet suitably is a silicone-based adhesive sheet that, for the silicone-based adhesive sheet prior to heating, exhibits interfacial delamination of the adhesive sheet from a probe, and exhibits a maximum value for the adhesive strength, when a stainless steel probe with a diameter of 8 mm is lowered with the speed of 0.01 mm/s, in respect to the sheet surface, for any of the surfaces of the sheet, using a texture analyzer, to apply a load of 50 gf, which is held for 0.5 seconds, followed by raising the probe at a speed of 0.5 mm/s, where after the surface that has exhibited this maximum value for the adhesive strength is heated for three hours at between 100 and 200° C., the mode of delamination of the adhesive surface from another non-adhesive substrate changes to that of cohesive fracturing. Here the heating condition referenced above is a test condition for confirming whether or not there is permanent adhesion of the silicone adhesive sheet according to the present invention, where a low temperature of between 50 and 100° C. may be selected, and a heating time that is less than three hours or more than three hours may be selected, in actually causing expression of permanent adhesion. These heating conditions can be selected as appropriate depending on the manufacturing conditions, such as the type of substrate, the semiconductor, or the like. Moreover, the maximum value for the adhesive strength should be a value of 10 gf or more, or a value of 15 gf or more, where a range between 10 gf and 500 gf, or between 50 gf and 400 gf, is preferred. Note that "either surface" referenced above may be one surface or may be both surfaces, and the pulling distance wherein the maximum value for the adhesive strength is seen, and the maximum value for the adhesive strength itself, may be different for each surface. Given the object of the present invention, preferably the surfaces described above are surfaces that bond a semiconductor chip or a semiconductor wafer to an attaching portion on a semiconductor substrate. The adhesive surface is permanently adhered (=die bonding) to the semiconductor substrate through subsequent heating, or the like.

The present invention provides a silicone-based adhesive sheet that is equipped with a slight adhesive force that is well suited to manufacturing small semiconductor devices, including, in particular, MEMS devices, where the silicone-based adhesive sheet that satisfies the conditions set forth above is able to achieve the object of the present invention regardless of the composition thereof. That is, selecting a silicone-based adhesive sheet that has a maximum value for the adhesive strength when a stainless steel probe with a diameter of 8 mm is lowered with the speed of 0.01 mm/s, in respect to the sheet surface, for any of the surfaces of the sheet, using a texture analyzer, to apply a load of 50 gf, which is held for 0.5 seconds, followed by raising the probe at a speed of 0.5 mm/s, makes it possible to temporarily hold or temporarily secure the chip, or the like, on the substrate, making it possible to perform die bonding of the semiconductor device without producing problems such as misalignment or falling off due to vibrations. On the other hand, if a silicone-based adhesive sheet that does not have the maximum value for the adhesive strength in the testing as set forth above, then, with vibration, or the like, the chips, or the like, might become misaligned in preparation from the substrate, and might fall off.

In the silicone-based adhesive sheet according to the present invention, the method for achieving the slight adhesiveness, as described above, has no particular limitation thereon, and may be achieved through a combination of one or more means such as, for a cross-linkable silicone composition for forming a sheet, selecting or adding components that control the concentration of cross links (SiH/Vi ratio) in the composition, or that apply slight adhesiveness to the silicone resin, or the like, in the composition, or such as chemically modifying the surface that contacts the substrate when curing the composition. Note that the slight adhesiveness, specified using the texture analyzer described above, can be measured or identified objectively, and thus the slight adhesiveness of the surface should be designed into the range set forth above through an arbitrary method.

For the silicone-based adhesive sheet according to the present invention, there are no particular limitations in terms of the composition or the method for manufacturing, aside from expressing the permanent adhesion, described above, and providing the surface with the slight adhesiveness, specified using the texture analyzer; however, preferably it is formed through a cross-linked material of a cross-linkable silicone composition.

There is no particular limitation to the degree of cross-linking of the cross-linked material that forms the adhesive sheet, and examples include a completely cross-linked state wherein a cross-linkable silicone composition is cross-linked to a state wherein there ceases to be any substantial change in the hardness of the cross-linked material, and a state wherein cross-linking is performed incompletely, where although the material will swell through a solvent it does not completely dissolve, where the cross-linkable silicone composition loses fluidity, that is, a state such as the B-stage defined in JIS K 6800 (Adhesive Agents, Adhesive Terminology—"Thermally Curable Resin Semi-Cured Body").

In the silicone-based adhesive sheet set forth above, preferably the surface that is the slightly adhesive surface (one or both of the surfaces) has the adhesive strength maximum value described above, and expresses permanent adhesion, in respect to the adhered object in contact therewith, through heating in a range between 50 and 200° C., where preferably this layer is formed through a cross-linked material of a cross-linkable silicone composition. Here there is no limitation on the interior structure thereof, and, for example, an organic resin substrate, such as a silicone rubber sheet, a polyimide resin sheet, a polyester resin sheet, an epoxy resin sheet, or the like, or an inorganic filling agent, such as silica particles, glass particles, alumina particles, or the like, or an organic filling agent, such as silicone rubber particles, polyimide resin particles, polyester resin particles, epoxy resin particles, or the like, may be included therein. There is no limitation on the shape of such a silicone-based adhesive sheet, nor any limitation on the thickness thereof, but in practice preferably it is in a range of between 1 and 5000 μm, and particularly preferably in a range between 10 and 1000 μm, or may be in a range between 10 and 500 μm.

In particular, the silicone-based adhesive sheet according to the present invention preferably is that wherein a composition is cross-linked between substrates that are releasable in respect to the cross-linked material of the cross-linkable silicone composition, where preferably at least one of the substrates has an oxygen atom and/or a sulfur atom in the surface that contacts the composition.

Preferably the oxygen atom is an atom that structures a group selected from a set comprising carbonyl groups, alkoxy groups, ester groups, and ether groups. Moreover, preferably the sulfur atom is an atom that structures a group selected from a set comprising sulfone groups and thioether groups. Whether or not there is an oxygen atom and/or sulfur atom in the surface of the substrate that has such releaseability, and, in particular, whether or not there is a group wherein an oxygen atom and/or sulfur atom is a constituent atom, can be confirmed easily using, for example, element analysis, fluorescent x-ray analysis, x-ray microanalyzer analysis, infrared radiation absorption analysis, ESCA analysis, or the like. Moreover, there is no limitation on the inclusion proportion of such atoms or groups, where the inclusion proportion should be of a degree that is detectable using an analytical method as described above.

The substrate that has such an atom or group and that has releaseability may be, for example, a polyester resin, a polyether resin, a polyether ether ketone resin, an epoxy resin, a phenol resin, a polyoxymethylene resin, a polyimide resin, a polyether imide resin, a polysulfone resin, a polyether sulfone resin, a polyphenylene sulfide resin, or the like that has such an atom or a group in the structural molecules thereof, or may be a material that does not include such an atom or a group in the structural molecules thereof, wherein an oxygen atom or a sulfur atom is bonded chemically to the surface thereof, or a group that uses such an atom as a structural atom is introduced through a corona process, a glow process, a plasma process, an ozone process, an ultraviolet radiation process, or another physical or chemical process, on the surface of a polyethylene resin, a polypropylene resin, a fluorine resin fat, or the like. Moreover, it may instead be a substrate that is structured from these resins alone, or a composite material structured from these organic resins. Furthermore, preferably the substrate is a substrate that has a high dielectric constant and/or refractive index when compared to the cross-linked material of the cross-linkable silicone composition.

There are no limitations on the shapes of these substrates, and if a sheet-shaped substrate is used, then that which can be used as-is as a protective material for this silicone-based adhesive sheet is preferred; for example, that which can be used by stripping this protective material is preferred when it is adhered to an adhered object such as a semiconductor chip or the chip attaching portion. Moreover, it may instead be re-adhered to another releasable substrate after the silicone-based adhesive sheet has been manufactured. In this case, there is no limitation on the releasable substrate.

For example, when the silicone-based adhesive sheet according to the present invention is a cross-linked material of a cross-linkable silicone composition, and the composition is cross-linked between substrates that have releaseability in respect to the cross-linked material, then preferably that which is ultimately produced is held between substrates that have releaseability in respect to the sheet is a silicone-based adhesive sheet that has the distinctive feature of having an oxygen atom or a sulfur atom in the surface that contacts the sheet for at least one of the substrates.

[Cross-Linkable Silicone Composition]

The silicone-based adhesive sheet preferably uses that which is of a hydrosilylation reaction type as the cross-linkable silicone composition, and, in particular, preferably the hydrosilylation reaction-type cross-linkable silicone composition is a cross-linkable silicone composition comprising at least: (A) organopolysiloxane having at least two silicon atom-bonded alkenyl groups in a single molecule; (B) an organopolysiloxane having at least two silicon atom-bonded hydrogen atoms in a single molecule; (C) at least one type of adhesion promoting agent; and (D) a catalyst for a hydrosilylation reaction.

The (A) component is the main ingredient in the composition described above, and is structured from an organopolysiloxane that includes one or more types of alkenyl groups. There is no particular limitation on the molecular structure of the organopolysiloxane that includes alkenyl groups, and it may be, for example, straight, branched, cyclic, of a three-dimensional network structure, or a combination thereof. Moreover, the silicon atom-bonded alkenyl group in the (A) component may be, for example, a vinyl group, an allyl group, a butenyl group, a pentenyl group, a hexenyl group, where a vinyl group is particularly preferred. The bonding position for the alkenyl group may be on an end of the molecular chain and/or a side chain of the molecular chain. Moreover, groups other than alkenyl groups bonded to silicon atoms in the (A) component may be, for example, alkyl groups such as methyl groups, ethyl groups, propyl groups, butyl groups, pentyl groups, hexyl groups, heptyl groups, and the like; aryl groups such as phenyl groups, tolyl groups, xylyl groups, naphtyl groups, and the like; aralkyl groups such as benzyl groups, phenethyl groups, and the like; or substituted or nonsubstituted monofunctional hydrocarbon groups such as halogenated alkyl groups, such as chloromethyl groups, 3-chloropropyl groups, 3,3,3-trifluoropropyl groups, or the like, wherein: methyl groups and phenyl groups are particularly preferred. Moreover, for the silicone-based adhesive sheet that is produced to have superior durability to cold, and to further improve the reliability of the semiconductor device that is manufactured using the silicone-based adhesive sheet, preferably the inclusion proportion of phenyl groups, in respect to the organic groups that are bonded to silicon atoms in the (A) component, is no less than 1 mol %, and, more preferably, in a range between 1 and 60 mol %, and, in particular, preferably it is in a range between 1 and 30 mol %. Moreover, while there is no particular limitation on the viscosity of the (A) component, preferably the viscosity at 25° C. is in a range between 100 and 1,000,000 Pa·s.

Particularly preferably, the (A) component is an organopolysiloxane that includes a straight-chain alkenyl group, and preferably includes alkenyl groups at least both ends of the molecular chain, and may include alkenyl groups at only both ends of the molecular chain. There is no particular limitation on this type of (A) component, and it may be, for example, a dimethyl polysiloxane blocked with dimethylvinylsiloxy groups on both ends of the molecular chain, a copolymer of methyl phenyl with dimethyl siloxane that is blocked with dimethylvinyl siloxy groups on both ends of the molecular chain, a copolymer of methylvinyl siloxane with dimethyl siloxane that is blocked with trimethyl siloxy groups on both ends of the molecular chain, a copolymer of methylphenyl siloxane, methylvinyl siloxane, and dimethyl siloxane that is blocked with trimethyl siloxy groups on both ends of the molecular chain, a copolymer of methylvinyl siloxane with dimethyl siloxane that is blocked with silanol groups on both ends of the molecular chain, polymers wherein a portion of the methyl groups of these polymers is substituted with alkyl groups other than methyl groups, such as ethyl groups, propyl groups, or the like, or halogenated alkyl groups such as 3,3,3-trifluoropropyl groups, polymers wherein the vinyl groups of these polymers are substituted with alkenyl groups other than vinyl groups, such as allyl groups, butenyl groups, hexenyl groups, or the like, or mixtures of two or more of these polymers. Note that from the perspective of preventing contact point damage, and the like, preferably the low molecular weight siloxane oligomers (octamethyl tetrasiloxane (D4) and decamethyl pentasiloxane (D5)) are reduced or eliminated from these alkenyl group-including organopolysiloxanes.

The (B) component is the cross-linking agent in the composition set forth above, and is an organopolysiloxane having at least two silicon atom-bonded hydrogen atoms in a single molecule. The molecular structure of this (B) component may be a straight-chain, a straight-chain having a partial branch, a branched chain, cyclic, or of a network structure. Moreover, the bonding positions of the hydrogen atoms that are bound to silicon atoms in the (B) component may be, for example, on the molecular chain ends and/or molecular chain side chains. Moreover, in the (B) component, groups other than hydrogen atoms that are bonded to silicon atoms may be, for example, alkyl groups such as methyl groups, ethyl groups, propyl groups, butyl groups, pentyl groups, hexyl groups, heptyl groups, or the like; aryl groups such as phenyl groups, tolyl groups, xylyl groups, naphtyl groups, and the like; aralkyl groups such as benzyl groups, phenethyl groups, and the like; or substituted or nonsubstituted monofunctional hydrocarbon groups such as chloromethyl groups, 3-chloropropyl groups, 3,3,3-trifluoropropyl groups, or the like, where methyl groups and phenyl groups are particularly preferred. Moreover, while there is no limitation on the viscosity of the (B) component, the viscosity at 25° C. is in a range between 1 and 1000 mPa·s, and preferably in a range between 1 and 500 mPa·s. Moreover, from the perspective of preventing contact point damage, and the like, the low molecular weight siloxane oligomers (octamethyl tetrasiloxane (D4) and decamethyl pentasiloxane (D5)) may be reduced or eliminated.

Note that the number (mean) of the hydrogen atoms that are bonded to silicon atoms in the structure and molecule of the (B) component may be designed from the perspective of flexibility of the cured material obtained through curing of the composition of the present invention. For example, from the perspective of improving repairability, such as for repair and reuse, and the like, with superior releaseability from the member, and flexibility of the organopolysiloxane cured material produced, a straight chain organo hydrogen polysiloxane having at least two molecular chain side chains may be used as a chain length extending agent, and, for the purpose of producing a cured material with high hardness, an organo hydrogen polysiloxane with a large number of silicon atom-bound hydrogen atoms in a side chain may be used as a cross-linking agent, and these may also be used in parallel.

For the blending quantity of the (B) component, the amount should be enough to cause cross-linking of the (A) component, described above, and preferably is an amount in a range wherein the hydrogen atoms that are bonded to silicon atoms in this component are between 0.5 and 10 moles in respect to one mole of the silicon atom-bonded alkenyl groups in the (A) component, described above, and, in particular, an amount wherein this is in a range of between 1 and 3 moles is preferred. This is because if, in the composition described above, the silicon atom-bonded hydrogen atoms in this component were less than the number of moles of the range described above, in respect to one mole of the silicon atom-bonded alkenyl groups in the (A) component, there would be a tendency for cross-linking of the composition to be difficult, and, on the other hand, if a number of moles in excess of this range, then there would be a tendency for reduced thermal durability of the cross-linked material obtained through cross-linking of the composition described above.

The (C) component is a component for bestowing good adhesiveness to the cross-linked material of the composition set forth above, and is one or more type of adhesive promoting agent, and is preferably one or more type of adhesive promoting agent selected from a group comprising: (i) siloxanes having one or more silicon atom-bonded alkenyl groups or silicon atom-bonded hydrogen atoms and silicon atom-bonded alkoxy groups within a single molecule; (ii) organosiloxanes having at least one each of monofunctional organic groups including a silicon atom-bonded alkenyl group, a silicon atom-bonded alkoxy group, and a silicon atom-bonded epoxy within a single molecule; (iii) a mixture or reaction mixture of a silane or siloxane having at least one silicon atom-bonded alkoxy group within a single molecule and an organosiloxane having at least one each of a silicon atom-bonded hydroxyl group and a silicon atom-bonded alkenyl group within a single molecule; and (iv) a mixture or reaction mixture of an organosilane or organosiloxane having at least one each of a monofunctional organic group, including silicon atom-bonded alkoxy groups and silicon atom-epoxy groups, within a single molecule, and an organosiloxane having at least one each of a silicon atom-bonded hydroxyl group and a silicon atom-bonded alkenyl group within a single molecule.

Of these (C) components, the molecular structure for a siloxane that has a silicon atom-bonded alkenyl group or at least one each of a silicon atom-bonded hydrogen atom and a silicon atom-bonded alkoxy group, may be a straight-chain, a straight-chain having a partial branch, a branched chain, a ring, or a network, where a straight-chain, a partially branched chain, and a network are particularly preferred. The silicon atom-bonded alkenyl group in the siloxane may be, for example, a vinyl group, an allyl group, a butenyl group, a pentenyl group, or a hexenyl group, where a vinyl group is particularly preferred. Moreover, the silicon atom-bonded alkoxy group in the siloxane may be, for example, a methoxy group, an ethoxy group, a propoxy group, a butoxy group, or a methoxyethoxy group, where a methoxy group is particularly preferred. Moreover, groups other than the alkenyl groups, hydrogen atoms, and alkoxy groups, bonded to silicon atoms, in this siloxane may be, for example, alkyl groups such as methyl groups, ethyl groups, propyl groups, butyl groups, pentyl groups, hexyl groups, and heptyl groups; aryl groups such as phenyl groups, tolyl groups, xylyl groups, naphtyl groups, and the like; aralkyl groups such as benzyl groups, phenethyl groups, and the like, substituted or nonsubstituted monofunctional hydrocarbon groups such as halogenated alkyl groups such as chloromethyl groups, 3-chloropropyl groups, 3,3,3-trifluoropropyl groups, and the like; glycidoxy alkyl groups such as 3-glycidoxy propyl groups, glycidoxy butyl groups, and the like; (3,4-epoxy cyclohexyl) alkyl groups such as 2-(3, 4-epoxy cyclohexyl) ethyl groups, 3-(3,4-epoxy cyclohexyl) propyl groups, and the like; and monofunctional organic groups that include epoxy, such as oxiranyl alkyl groups such as, for example, 4-oxiranyl butyl groups, 8-oxiranyl octal groups, and the like, where, given the ability to impart good adhesive properties to a variety of different substrates, preferably at least one unified organic group that includes an epoxy is included in a single molecule. There is no limitation on the viscosity of such a siloxane, but preferably it is in a range of between 1 and 500 mPa·s at 25° C.

Of these (C) components, in mixtures of silanes or siloxanes that have at least one silicon atom-bonded alkoxy group and an organosiloxane having at least one each of a silicon atom-bonded hydroxyl group and a silicon atom-bonded alkenyl group in a single molecule, the alkoxy group that is bonded with the silicon atom in the silane in the former is, for example, a methoxy group, an ethoxy group, a propoxy group, a butoxy group, or a methoxy ethoxy group, where a methoxy group is particularly preferred. Moreover, groups other than the alkoxy groups bonded to silicon atoms, in this silane may be, for example, alkyl groups such as methyl groups, ethyl groups, propyl groups, butyl groups, pentyl groups, hexyl groups, and heptyl groups; alkenyl groups such as vinyl groups, aryl groups, butenyl groups, pentenyl groups, and hexenyl groups, and the like; aryl groups such as phenyl groups, tolyl groups, xylyl groups, naphtyl groups, and the like; aralkyl groups such as benzyl groups, phenethyl groups, and the like, substituted or nonsubstituted monofunctional hydrocarbon groups such as halogenated alkyl groups such as chloromethyl groups, 3-chloropropyl groups, 3,3,3-trifluoropropyl groups, and the like; glycidoxy alkyl groups such as 3-glycidoxy propyl groups, glycidoxy butyl groups, and the like; (3,4-epoxy cyclohexyl) alkyl groups such as 2-(3,4-epoxy cyclohexyl) ethyl groups, 3-(3,4-epoxy cyclohexyl) propyl groups, and the like; and monofunctional organic groups that include epoxy, such as oxiranyl alkyl groups such as, for example, 4-oxiranyl butyl groups, 8-oxiranyl octal groups, and the like, where, given the ability to impart good adhesive properties to a variety of different substrates, preferably at least one unified organic group that includes an epoxy is included in a single molecule.

Moreover, as the molecular structure for the siloxane in the former, it may be a straight-chain, a straight-chain having a partial branch, a branched chain, a ring, or a network, where the straight-chain, the branched chain, and the network are preferred. Moreover, the alkoxy group that is bonded to the silicon in the siloxane may be, for example, a methoxy group, an ethoxy group, a propoxy group, a butoxy group, or a methoxyethoxy group, where a methoxy group is particularly preferred. Moreover, groups other than the alkoxy groups bonded to silicon atoms, in this siloxane may be, for example, alkyl groups such as methyl groups, ethyl groups, propyl groups, butyl groups, pentyl groups, hexyl groups, and heptyl groups; alkenyl groups such as vinyl groups, aryl groups, butenyl groups, pentenyl groups, and hexenyl groups, and the like; aryl groups such as phenyl groups, tolyl groups, xylyl groups, naphtyl groups, and the like; aralkyl groups such as benzyl groups, phenethyl groups, and the like, substituted or nonsubstituted monofunctional hydrocarbon groups such as halogenated alkyl groups such as chloromethyl groups, 3-chloropropyl groups, 3,3,3-trifluoropropyl groups, and the like; glycidoxy alkyl groups such as 3-glycidoxy propyl groups, glycidoxy butyl groups, and the like; (3,4-epoxy cyclohexyl) alkyl groups such as 2-(3,4-epoxy cyclohexyl) ethyl groups, 3-(3,4-epoxy cyclohexyl) propyl groups, and the like; and monofunctional organic groups that include epoxy, such as oxiranyl alkyl groups such as, for example, 4-oxiranyl butyl groups, 8-oxiranyl octal groups, and the like, where, given the ability to impart good adhesive properties to a variety of different substrates, preferably at least one unified organic group that includes an epoxy is included in a single molecule. There is no limitation on the viscosity of such a siloxane, but preferably it is in a range of between 1 and 500 mPa·s at 25° C.

Moreover, as the molecular structure for the organosiloxane in the latter, it may be a straight-chain, a straight-chain having a partial branch, a branched chain, a ring, or a network, where the straight-chain, the branched chain, and the network are preferred. The silicon atom-bonded alkenyl group in the organosiloxane may be, for example, a vinyl group, an allyl group, a butenyl group, a pentenyl group, or a hexenyl group, where a vinyl group is particularly preferred. Moreover, groups other than hydroxy groups and alkenyl groups bonded to silicon atoms in the organosiloxane may be, for example, alkyl groups such as methyl groups, ethyl groups, propyl groups, butyl groups, pentyl groups, hexyl groups, heptyl groups, and the like; aryl groups such as phenyl groups, tolyl groups, xylyl groups, naphtyl groups, and the like; aralkyl groups such as benzyl groups, phenethyl groups, and the like; or substituted or nonsubstituted monofunctional hydrocarbon groups such as halogenated alkyl groups, such as chloromethyl groups, 3-chloropropyl groups, 3,3,3-trifluoropropyl groups, or the like. There is no limitation on the viscosity of such an organosiloxane, but preferably it is in a range of between 1 and 500 mPa·s at 25° C.

There is no limitation on the proportions of the silane or siloxane that has at least one silicon atom-bonded alkoxy group and the organosiloxane that has at least one each of a silicon atom-bonded hydroxyl group and a silicon atom-bonded alkenyl group in a single molecule, but, given the ability to impart particularly good adhesive properties, preferably the weight proportion of the former, the silane or siloxane, and the latter, the organosiloxane, is in a range of between 1/99 and 99/1.

A reaction mixture of an alkoxy silane that has an organic base that includes an amino acid group, and an alkoxy silane that has an organic group that includes an epoxy group can be used as the adhesion imparting agent in the present invention, where preferably the reaction proportion is between (1:1.5) and (1:5), in terms of mole ratios, and particularly preferably within a range of (1:2) through (1:4). This component is easily synthesized through mixing an alkoxy silane that has an organic group that includes an amino group and an alkoxy silane that has an organic group that includes an epoxy group, and reacting at room temperature or through heating.

In particular, in the present invention, when reacting an alkoxy silane that has an organic group that includes an amino acid and an alkoxy silane that has an organic group that includes an epoxy group through the method described in Japanese Unexamined Patent Application Publication H10-195085, it is particularly preferable that a carbasilatran derivative, which forms a ring through an alcohol substituent reaction, be used that is expressed by the following general formula:

[Chemical Formula 1]

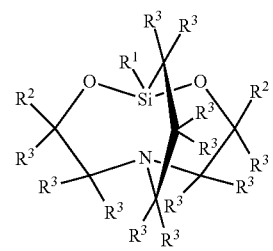

{where, in the formula, $R^1$ is an alkyl group or an alkoxy group, and $R^2$ is identical or different selections from groups expressed by the following general formula:

[Chemical Formula 2]

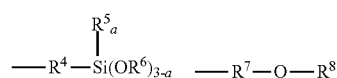

(wherein $R^4$ is an alkalene group or an alkalene oxyalkylene group, $R^5$ is a monofunctional hydrocarbon group, $R^6$ is an alkyl group, $R^7$ is an alkalene group, $R^8$ is an alkyl group, an alkenyl group, or an asyl group, and a is 0, 1, or 2)

and $R^3$ is identical or different selections from hydrogen atoms or alkyl groups}. This carbasilatran derivative may be a silatran derivative that has, within the molecule, an alkenyl group and a silicon atom-bonded alkoxy group, expressed by the following structure:

[Chemical Formula 3]

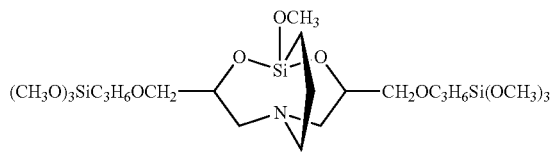

This component has at least two alkoxy silyl groups in a single molecule, and is an organic compound that includes bonds other than the silicon-oxygen bonds between these silyl groups, and along with improving the initial adhesion by itself, it works in particular to improve the adhesion durability of the cured material under harsh conditions, through inclusion of this adhesion promoting agent, through use together with another adhesion imparting agent.

The blending quantity of the (C) component is an amount adequate to impart good adhesiveness to the cross-linked material of the composition described above, and, for example, preferably is an amount in a range of between 0.01 and 20 parts by weight relative to 100 parts by weight of the (A) component, and, particularly preferably, an amount in a range of between 0.1 and 10 parts by weight. This is because if the blending quantity of the (C) component were an amount less than this range, there would be a tendency to have reduced adhesiveness of the cured material, and, on the other hand, if greater than this range, there would be no effect on the adhesiveness, but, conversely, there would be a tendency to reduce the stability of the silicone-based adhesive sheet.

The (D) component is a catalyst for promoting curing through a hydrosilylation reaction of the composition described above, and may be a platinum-based catalyst, a rhodium-based catalyst, or a palladium-based catalyst, and given the ability to remarkably promote curing of the present composition, a platinum-based catalyst is preferred. This platinum-based catalyst may be a platinum ultra-powder, platinum black, platinum carried on a silica ultra-powder, platinum carried on activated charcoal, chloroplatinic acid, an alcohol solution of chloroplatinic acid, a platinum-alkenyl siloxane complex, a platinum-olefin complex, a platinum-carbonyl complex, or a catalyst wherein these platinum-based catalysts are dispersed or encapsulated in a thermoplastic resin such as a silicone resin, a polycarbonate resin, an acrylic resin, or the like, and, given its good reaction speed, a platinum-alkenyl siloxane complex is preferred. The alkenyl siloxane may be, for example, 1,3-divinyl-1,1,3,3-tetramethyl disiloxane, or 1,3,5,7-tetramethyl-1,3,5,7-tetravinyl chlorotetrasiloxane, an alkenyl siloxane wherein a portion of the methyl groups of these alkenyl siloxanes have been substituted with ethyl groups, phenyl groups, or the like, an alkenyl siloxane wherein vinyl groups of these alkenyl siloxanes have been substituted with allyl groups, hexenyl groups, or the like, and so forth. In particular, given the good stability of the platinum-alkenyl siloxane complex, 1,3-divinyl-1,1,3,3-tetramethyl disiloxane is preferred. Additionally, from the perspective of improving ease of handling and pot life of the composition, a platinum-including hydrosilylation reaction catalyst in the form of a dispersion in a thermoplastic resin or encapsulated microparticles may be used. Note that the catalyst for promoting the hydrosilylation reaction may instead be a non-platinum-based metal catalyst, such as iron, ruthenium, iron/cobalt, or the like.

The blending quantity for the (D) component is an amount adequate to promote curing of the composition, and when a platinum-based catalyst is used, is an amount wherein the platinum metal atoms will be in a range of between 0.01 and 500 ppm, in terms of mass units, in the composition, or an amount so as to be in a range of between 0.01 and 100 ppm, where an amount so as to be in a range of between 0.01 and 50 ppm is preferred. This is because if the blending quantity of the (D) component were an amount less than this range, there would be a tendency for the curing speed of the composition produced to be remarkably slow, while, on the other hand, if an amount that is more than this range, there would be little effect on the curing speed, and, conversely, it could cause a problem with coloration, or the like.

The composition described above is produced through mixing the (A) component through (D) component uniformly, and causing a hydrosilylation reaction at room temperature or through heating to a temperature range between room temperature and 200° C., and preferably through heating to a temperature range between room temperature and 150° C., and then forming a silicone-based adhesive sheet according to the present invention that is a cross-linked material of a cross-linkable silicone composition. When heating the composition described above, care is required so as to not cause the composition to completely adhere to the substrate, which would make delamination impossible.

In order to adjust the hydrosilylation reaction speed of the composition and to improve the stability of the semi-cured material or the fully cured material, preferably a hydrosilylation reaction inhibiting agent is mixed into the composition. While preferably this hydrosilylation reaction inhibiting agent is: an acetylene-based compound such as 3-methyl-1-butyne-3-ol, 3,5-dimethyl-1-hexyne-3-ol, 3-phenyl-1-butyne-3-ol, or the like; an enyne compound such as 3-methyl-3-pentene-1-yne, 3,5-dimethyl-3-hexene-1-yne, or the like; a cycloalkenyl siloxane such as 1,3,5,7-tetramethyl-1,3,5,7-tetravinyl cyclotetrasiloxane, 1,3,5,7-tetramethyl-1,3,5,7-tetrahexenyl cyclotetrasiloxane, or the like; or a triazole compound such as benzotriazole, or the like; etc., these can be used without any particular limitation. The blending quantities thereof will differ depending on the curing conditions of the compositions described above, but in practice preferably they are in the range of between 0.00001 through 5 parts by weight in respect to 100 parts by weight of the (A) component.

Moreover, for the cross-linkable silicone composition, as described above, other arbitrary components may be precipitated silica, fumed silica, calcinated silica, titanium oxide, alumina, glass, quartz, aluminosilicate, iron oxide, zinc oxide, calcium carbonate, carbon black, silicon carbide, silicon nitride, boride nitride, or other inorganic filling agents, or inorganic filling agents wherein these filling agents have been treated with an organic silicon compound such as an organo halosilane, an organo alkoxysilane, an organo silazane, or the like; an organic resin ultra-powder such as silicone resin, epoxy resin, or fluorine resin; a filling agent such as a conductive metal powder such as copper, or the like; and dyes, pigments, flame retardants, solvents, and the like, can be mixed therein. Furthermore, insofar as the object of the present invention is not impaired, curable epoxy resins, curable epoxy modified silicone resins, curable silicone modified epoxy resins, curable polyimide resins, curable polyimide modified silicone resins, curable silicone modified polyimide resins, and the like, may be mixed in.

[Method for Manufacturing the Silicone-Based Adhesive Sheet]

The silicone-based adhesive sheet described above can be manufactured through a method wherein the composition between substrates that have releaseability in respect to a cross-linked material of a cross-linkable silicone composition, for example, is cross-linked, and at least one of the substrates has an oxygen atom and/or a sulfur atom in the surface that contacts the composition. The oxygen atoms and/or sulfur atoms are the same as described above.

In this method for manufacturing, the method for manufacturing the silicone-based adhesive sheet may be, for example, a method wherein a cross-linkable silicone composition is cross-linked in a state wherein it is held between the substrates, described above, or a method wherein the composition is coated uniformly on both surfaces of substrates such as silicone rubber sheets or organic resin sheets, or the like, and is cross-linked in a state wherein it is held between these substrates; or a method wherein a composition that has a filling agent, such as silicone rubber particles, organic resin particles, inorganic particles, or the like, mixed therein is cross-linked in a state wherein it is held between the substrates. In order to prepare the silicone-based adhesive sheet that is held between these substrates, preferably the cross-linkable silicone composition is cross-linked after forming, or during forming, using two rollers or a pressing machine.

[Applications]

The silicone-based adhesive sheet according to the present invention preferably is used for the purpose of adhering a semiconductor chip or a wafer for a semiconductor to an attaching portion, and, in particular, preferably is a die attach film application used in MEMS devices. Here "MEMS device" is a general term for a semiconductor device that is formed using a semiconductor microprocessing technology which is generally known as a "micro electromechanical system," and may be an inertia sensor such as an acceleration sensor or an angular velocity sensor, or the like, equipped with an MEMS chip. Moreover, known semiconductor devices may be used without limitation, and may be, for example, diodes, transistors, thyrister, monolithic ICs, hybrid ICs, LSIs, VLSIs, or the like, and semiconductor chips for these semiconductor devices (including MEMS devices) may be secured temporarily to the chip attaching portion by the silicone-based adhesive sheet according to the present invention, followed by bonding permanently through heating, or the like.

[Layered Body]

The silicone-based adhesive sheet described above, from the perspective of ease of handling, preferably is held between substrates that have releaseability in respect to the sheet, and this is a sheet-shaped layered body that has, as a distinctive feature, that at least one of the substrates has an oxygen atom or a sulfur atom in the surface that contacts the sheet, and preferably is a die attach film for a semiconductor chip or for a wafer for semiconductors.

The silicone-based adhesive sheet described above should be layered on a member for a semiconductor, such as a wafer for a semiconductor or a chip for a semiconductor that is used in a semiconductor device described above (and, in particular, in an MEMS device, or the like). There is no particular limitation to the method for layering, but it may be through direct layering using the slight adhesiveness that is a distinctive feature of this silicone-based adhesive sheet, or may be through bonding or thermal bonding. The member for a semiconductor that is a wafer for a semiconductor or a chip for a semiconductor, equipped with the silicone-based adhesive sheet, may be divided into individual pieces using known means, such as dicing, or the like, in the state wherein it is a layered body, and, as a chip (die) for a semiconductor, equipped with the silicone-based adhesive sheet according to the present invention, may be disposed (mounted) on an attaching portion on a semiconductor substrate, such as a die pad, or the like. Moreover, at this time the surface of the silicone-based adhesive sheet of the attaching portion being provided with slight adhesiveness, described above, enables the chip (die) for the semiconductor to be secured temporarily to the semiconductor substrate easily and extremely quickly through contact bonding or physical placement, providing the benefit of reducing the likelihood of misalignment or falling off due to vibrations.

For the semiconductor substrate, there are no limits beneficially regarding the material, etc., thereof, and it may be a substantially flat plate shape, and while there is no particular limitation on the material, it may be, for example, a semiconductor chip, a metal such as iron, zinc, copper, or a magnesium alloy, a ceramic, glass, epoxy resin, a polyimide resin, a phenol resin, a bakelite resin, a melamine resin, a fiber-reinforced epoxy resin, a plastic such as an acrylic resin, ABS, SPS, or the like, or glass, or the like. Note that while there is no particular limitation on the thickness of the substrate, it may be between 0.1 and 10 mm. Note that this may be a non-adhesive substrate that, of itself, is not adhesive.

[Semiconductor Device Precursors and Permanent Bonding]

This type of layered body is a precursor for the semiconductor device described above (and, in particular, an MEMS device, or the like), and, simply, is a layered body having a structure wherein a semiconductor chip or a wafer for a semiconductor is placed on a substrate with the silicone-based adhesive sheet interposed therebetween. The layered body may be a precursor for a semiconductor device having a structure wherein the semiconductor chip (die) that was divided into an individual piece through dicing is placed on a circuit board, of a die pad, or the like, with the silicone-based adhesive sheet, set forth above, interposed therebetween, to be held temporarily (temporarily secured), and, in particular, may be a precursor for an MEMS device. The entirety of the layered body may be heated to, for example, 50° C. or more, to produce a semiconductor device (and arbitrarily an MEMS device) that has a structure wherein the semiconductor chip or the wafer for semiconductors is secured onto the substrate through the cured material of the silicone-based adhesive sheet described above. Note that the heating time and heating temperature for causing expression of the permanent bonding is the same as that which was described above.

The semiconductor device (and, particularly, the MEMS device, or the like) described above may further comprise circuit interconnections, or bonding wires or bumps for the purpose of connecting the chip and circuit interconnections, and a resin layer for sealing some or all of the circuit interconnections or the chip, and may be designed as appropriate depending on the semiconductor device or the type of application. Moreover, the semiconductor device may have a structure that is disposed horizontally, or a structure that is disposed vertically, or a structure that is layered three dimensionally. The silicone-based adhesive sheet described above has slight adhesiveness on the surface thereof, and thus temporary securing and repositioning is possible even if disposed in other than the horizontal direction, and after being secured temporarily to an attaching portion in the design, there will be a resistance to the position shifting due to impacts or vibrations accompanying other interconnections, or the like, enabling the permanent bonding of the chips, or the like, to be carried out easily through heating, in that form, the semiconductor device precursor, and thus there is the benefit of being able to handle the design and manufacturing processes for a variety of semiconductor devices flexibly.

[Method for Manufacturing the Semiconductor Device]

The silicone-based adhesive sheet according to the present invention is well suited to manufacturing of a semiconductor device (and preferably an MEMS device), and uses a manufacturing method for a semiconductor device that has the following steps:

Step 1: A step for layering the silicone-based adhesive sheet, described above, on the back face of a wafer for a semiconductor;

Step 2: A step for forming individual pieces through dicing the layered body obtained in Step 1, above;

Step 3: A step for arranging, on a semiconductor substrate, with the surface of the silicone-based adhesive sheet interposed therebetween, the pieces of the wafer for the semiconductor, obtained in Step 2, above; and Step 4: A step for heating, in a range of between 50 and 200° C., the structural unit, produced in Step 3, wherein the individual pieces of the wafer for the semiconductor are disposed on the semiconductor substrate, with the surface of the silicone-based adhesive sheet interposed therebetween, to bond the pieces of the wafer for the semiconductor onto the top of the semiconductor substrate through the silicone-based adhesive sheet.

This Step 1 is a step for layering the silicone-based adhesive sheet, described above, on the back face of a wafer for the semiconductors, a step for forming a wafer for semiconductors having the silicone-based adhesive sheet equipped on at least one face thereof, through means such as, for example, contact bonding or placing onto the slightly adhesive surface. Note that, at this time, if desired, electrodes or a protective film may be formed on the wafer in advance. Moreover, after adhesion of the silicone-based adhesive sheet, the excess silicone-based adhesive sheet may be trimmed off, and a sheet-shaped substrate that is releasable, that covers the side of the silicone-based adhesive sheet that attaches to the semiconductor substrate, may be peeled off in advance.

Step 2 is a so-called dicing step, a step for dividing, into individual semiconductor chips (dice), the wafer for the semiconductors on which at least one face is equipped with the silicone-based adhesive sheet. In manufacturing MEMS devices, suitably a semiconductor chip with length and width of no more than 10 mm, and preferably no more than 5 mm, is manufactured, and this is preferred. Note that if the side of the surface of the silicone-based adhesive sheet that will attach to the semiconductor substrate is still covered by the releasable sheet-shaped substrate even at this stage, it will be necessary to strip the sheet-shaped substrate prior to Step 3.

Step 3 is known as the mounting step, the step for manufacturing the semiconductor precursor wherein the semiconductor chip (die) that has been formed into an individual piece through dicing is placed on the circuit board of a die pad, or the like, with the silicone-based adhesive sheet interposed therebetween, and temporarily held (temporarily secured). Note that, after this step, the semiconductor chip may be processed through sputtering, or an interconnection process for electrodes, or the like, may be performed.

Step 4 is a step for permanent bonding of the silicone-based adhesive sheet according to the present invention and the adhered object, where the individual piece of the wafer for the semiconductors is bonded by the silicone-based adhesive sheet onto a semiconductor substrate through post-curing. In this case, the heating conditions, etc., are as described above. Note that because, in Step 4, a large number of structural units wherein pieces of wafers for semiconductors are placed on a semiconductor substrate, which a silicone-based adhesive sheet interposed therebetween, can be processed simultaneously, the industrial manufacturing efficiency is remarkably good, and mass production can be carried out easily even for small high-precision semiconductor devices, such as MEMS devices. Note that high-energy beam irradiation, such as through ultraviolet radiation, may be carried out in parallel, in addition to the heating process in Step 4.

While a method for manufacturing a semiconductor device according to the present invention includes Step 1 through Step 4, above, if desired the process may also include a step for forming a protective film on the wafer, a step for a process for connecting to the semiconductor substrate, a step for connecting the chip and electrodes, a step for a polishing process, a step for partial or complete sealing, or the like, with arbitrary timing.

Moreover, as a method for manufacturing a semiconductor device (and, suitably, an MEMS device), the silicone-based adhesive sheet according to the present invention may be used in a method that uses the following steps:

Step 1: A step for dividing the silicone-based adhesive sheet, described above, into individual pieces of a size that approximates that of a semiconductor chip;

Step 2: A step for disposing, on a semiconductor substrate, the silicone-based adhesive sheet that has been divided into individual pieces in Step 1, above;

Step 3: A step for disposing a semiconductor chip onto the silicone-based adhesive sheet that has been divided into individual pieces, disposed on the semiconductor substrate in Step 2, above; and Step 4: A step for heating, in a range of between 50 and 200° C., the structural unit, obtained in Step 3, above, wherein a semiconductor chip is disposed on the semiconductor substrate, with the surface of the silicone-based adhesive sheet interposed therebetween, to bond the semiconductor chip onto the top of the semiconductor substrate through the silicone-based adhesive sheet.

Step 1 is a step for dividing the silicone-based adhesive sheet into individual pieces in advance, a step wherein the silicone-based adhesive sheet is caused to be approximately the size of the semiconductor chip to which it will be bonded, through means such as die cutting, laser cutting, punching, or the like. At this time, the silicone-based adhesive sheet may be contacted to a substrate, on one side or both sides, or may be transferred to another substrate. For ease in handling of the silicone adhesive sheet that has been divided into individual pieces in Step 2, described above, preferably one face is in contact with a substrate that has been divided into the same size.

Step 2 is a step for disposing the adhesive agent sheet, that has been cut into individual pieces, onto the semiconductor substrate, for temporarily holding (temporarily securing). The silicone-based adhesive sheet single layer or double layer with a releasable sheet-shaped substrate is picked up through a collet, or the like, and placed on the semiconductor substrate, and then the delaminating force between the semiconductor substrate and the silicone-based adhesive sheet is increased through heating. Note that if the side of the surface of the silicone-based adhesive sheet that will attach to the semiconductor substrate is still covered by the releasable sheet-shaped substrate even at this stage, it will be necessary to strip the sheet-shaped substrate prior to Step 3.

Step 3 is known as the mounting step, the step for manufacturing the semiconductor precursor wherein the semiconductor chip (die) that has been formed into an individual piece through dicing is placed on the silicone-based adhesive sheet that has been placed on a semiconductor substrate, and temporarily held (temporarily secured). Note that, after this step, the semiconductor chip may be processed through sputtering, or an interconnection process for electrodes, or the like, may be performed. Note that this member has a structure wherein the semiconductor substrate/silicone-based adhesive sheet/semiconductor chip are layered.

Step 4 is a step for permanent bonding of the silicone-based adhesive sheet according to the present invention and the adhered object, where the individual piece of the wafer for the semiconductors is bonded by the silicone-based adhesive sheet onto a semiconductor substrate through post-curing. In this case, the heating conditions, etc., are as described above. Note that because, in Step 4, a large number of structural units wherein pieces of wafers for semiconductors are placed on a semiconductor substrate, with a silicone-based adhesive sheet interposed therebetween, can be processed simultaneously, the industrial manufacturing efficiency is remarkably good, and mass production can be carried out easily even for small high-precision semiconductor devices, such as MEMS devices. Note that high-energy beam irradiation, such as through ultraviolet radiation, may be carried out in parallel, in addition to the heating process in Step 4.

While a method for manufacturing a semiconductor device according to the present invention includes Step 1 through Step 4, above, if desired the process may also include a step for forming a protective film on the wafer, a step for a process for connecting to the semiconductor substrate, a step for connecting the chip and electrodes, a step for a polishing process, a step for partial or complete sealing, or the like, with arbitrary timing.

When the silicone-based adhesive sheet according to the present invention is used as a permanent bonding layer it has specific elastomer properties (flexibility), and thus when compared to a synthetic resin sheet such as a known epoxy-based adhesive sheet, there is the benefit of being superior in mitigating shock and stress on the semiconductor chip (die) that is mounted on the semiconductor substrate. Through this, there is the benefit of being able to improve the manufacturing efficiency small high-precision semiconductor devices such as MEMS devices, and also the benefit of being able to improve reliability and yield.

EMBODIMENTS

The silicone-based adhesive sheet and manufacturing method thereof, and semiconductor device, according to the present invention, will be explained in detail through embodiments and reference examples, but the present invention is not limited thereto. Note that in the embodiments the "viscosity" is a value measured at 25° C., and the adhesiveness of the silicone-based adhesive sheet, and the state of the surface of the sheet, are evaluated, as described below, using a texture analyzer (model TAXT plus, manufactured by Eco Instruments Company, Limited).

Embodiments 1 Through 5 and Reference Examples 1 Through 4

While embodiments will be used below to explain the present invention, the present invention is not limited thereby. The compounds and compositions below are used as raw materials in Embodiments 1 through 5 and in Reference Examples 1 and 2, given below. Note that in Reference Examples 3 and 4, commercially available silicone adhesive agent products are used as-is.

[Components of the Curable Organopolysiloxane Composition]

(A1) Dimethyl polysiloxane blocked with dimethylvinyl siloxy groups on both ends of the molecular chain, with a viscosity of 2000 mPa·s (inclusion proportion of vinyl groups=0.23% by weight)

(A2) Dimethyl polysiloxane blocked with dimethylvinyl siloxy groups on both ends of the molecular chain, with a viscosity of 40,000 mPa·s (inclusion proportion of vinyl groups=0.08% by weight)

(A3) Dimethyl polysiloxane blocked with dimethylvinyl siloxy groups on both ends of the molecular chain, with a viscosity of 400 mPa·s (inclusion proportion of vinyl groups=0.44% by weight)

(A4) Dimethyl polysiloxane blocked with dimethylvinyl siloxy groups on both ends of the molecular chain, with a viscosity of 80 mPa·s (inclusion proportion of vinyl groups=1.50% by weight)

(A5) A silicone resin polysiloxane mixture comprising 70% by weight dimethyl polysiloxane blocked with dimethylvinyl siloxy groups on both ends of the molecular chain, with a viscosity of 2000 mPa·s (inclusion proportion of vinyl groups=0.23% by weight) and 30% by weight of an organopolysiloxane resin structured from $SiO_{4/2}$ units, $(CH_3)_3SiO_{1/2}$ units, and $(CH_3)_2(CH_2=CH)SiO_{1/2}$ units (inclusion proportion of vinyl groups=2.5% by weight)

(A6) A silicone resin polysiloxane mixture comprising 50 parts by weight dimethyl polysiloxane blocked with dimethylvinyl siloxy groups on both ends of the molecular chain, with a viscosity of 20,000 mPa·s (inclusion proportion of vinyl groups=1.75% by weight) and 50% by weight of an organopolysiloxane resin structured from $SiO_{4/2}$ units, $(CH_3)_3SiO_{1/2}$ units, and $(CH_3)_2(CH_2=CH)SiO_{1/2}$ units (inclusion proportion of vinyl groups=4.1% by weight)

(A7) A silicone resin polysiloxane mixture comprising 20 parts by weight dimethyl polysiloxane blocked with dimethylvinyl siloxy groups on both ends of the molecular chain, with a viscosity of 80 mPa·s (inclusion proportion of vinyl groups=1.50% by weight) and 80% by weight of an organopolysiloxane resin structured from $SiO_{4/2}$ units, $(CH_3)_3SiO_{1/2}$ units, and $(CH_3)_2(CH_2=CH)SiO_{1/2}$ units (inclusion proportion of vinyl groups=3.0% by weight)

(A8) A mixture of 80 parts by weight dimethyl polysiloxane blocked with dimethylvinyl siloxy groups on both ends of the molecular chain, with a viscosity of 2000 mPa·s (inclusion proportion of vinyl groups=0.23% by weight) and 20 parts by weight of a fumed silica that has a screened surface area of 200 m²/g, through the BET method (B1) A copolymer of methyl hydrogen siloxane and dimethyl siloxane blocked with trimethyl siloxy groups on both ends of the molecular chain, with a viscosity of 60 mPa·s (silicon atom-bonded hydrogen atom inclusion proportion=0.7% by weight)

(B2) Dimethyl siloxane blocked with dimethyl hydrogen siloxy groups on both ends of the molecular chain, with a viscosity of 15 mPa·s (silicon atom-bonded hydrogen atom inclusion proportion=0.12% by weight)

(B3) Methyl hydrogen polysiloxane blocked with trimethyl siloxy groups on both ends of the molecular chain, with a viscosity of 23 mPa·s (silicon atom-bonded hydrogen atom inclusion proportion=1.55% by weight)

(B4) An organo polysiloxane resin with a viscosity of 25 mPa·s made from $SiO_{4/2}$ units and $H(CH_3)_2SiO_{1/2}$ units (silicon atom-bonded hydrogen atom inclusion proportion=0.97% by weight)

(C1) An adhesion imparting agent that is a condensation reaction product, with a mass ratio of 1:1 of a copolymer of methylvinyl siloxane-dimethyl siloxane blocked with hydroxyl groups at both ends of the molecular chain, with a viscosity of 30 mPa·s, and 3-glycidoxy propyltrimethoxy silane (D) A complex of platinum and 1,3-divinyl-1,1,3,3-tetramethyl disiloxane, with a platinum density of 0.6% by weight (E) Components as reaction controlling agents:
(E1) Ethynyl cyclohexanol
(E2) 1,3,5,7-tetramethyl-1,3,5,7-tetravinyl cyclotetrasiloxane

[Preparation of the Curable Organopolysiloxane Composition and Silicone-Based Adhesive Sheet]

Each of the components listed above was mixed uniformly, except for the component (D), with the weight ratios (parts by weight) described in Table 1, below, and finally the component (D) was mixed with the weight ratios (parts by weight) described in Table 1. After vacuum degassing of the composition, it was held between the polyether sulfone resin films with thicknesses of 50 µm, the thicknesses of the compositions were adjusted so as to be 80 µm, through two stainless steel rollers for which the clearance had been set, and each composition was cross-linked through heating for 30 minutes in a hot air recirculating oven at 100° C. to produce the silicone-based adhesive sheets of Embodiments 1 through 5 and of Reference Examples 1 and 2. Note that the numbers of moles of the silicon atom-bonded atoms (SiH), in respect to one mole of the vinyl groups (Vi) in the composition, are expressed as mole ratios in Table 1.

TABLE 1

| Component (parts by weight) | Test Example | | | | | | |
|---|---|---|---|---|---|---|---|
| | Embodiments | | | | | Reference Examples | |
| | 1 | 2 | 3 | 4 | 5 | 1 | 2 |
| A1 | 22.4 | | 4.0 | | 7.5 | 3.0 | |
| A2 | | 5.2 | 31.1 | | | | |
| A3 | | | | 61.8 | 43.0 | | |
| A4 | | | | 5.0 | 6.6 | 20.0 | |
| A5 | | 50.9 | | | | | |
| A6 | | | | | | 27.7 | |
| A7 | | | | | | | 80.5 |
| A8 | 75.1 | 39.1 | 59.1 | 25.0 | 25.0 | 30.0 | |
| B1 | 1.8 | 4.2 | 3.5 | 6.4 | 1.3 | | |
| B2 | | | | | 14.7 | | |
| B3 | | | | | | 12.0 | 4.4 |
| B4 | | | | | | | 9.3 |
| C1 | 0.5 | 0.5 | 2.2 | 1.0 | 1.0 | 1.0 | 1.0 |
| D | 0.2 | 0.2 | 0.2 | 0.2 | 0.2 | 0.2 | 0.2 |
| E1 | 0.01 | 0.01 | 0.01 | 0.14 | 0.20 | 0.08 | 0.10 |
| E2 | | | | 0.5 | 0.5 | 6.0 | 4.5 |
| H/Vi (Mole Ratio) | 1.5 | 1.5 | 3 | 1.8 | 1.1 | 1.7 | 1.1 |

Reference Example 3

A silicon film with a thickness of 80 µm was produced through coating silicone adhesive agent SD4580 FC, manufactured by Toray-Dow Corning, to a thickness of 50 µm on a PET film, and thermally curing for five minutes at 120° C.

Reference Example 4

A silicon film with a thickness of 80 µm was produced through coating silicone adhesive agent SD4584 FC, manufactured by Toray-Dow Corning, to a thickness of 50 µm on a PET film, and thermally curing for five minutes at 120° C.

The surface characteristics of the silicone-based adhesive sheets according to the embodiments and according to reference examples, the temporary securing properties thereof, and the permanent adhesion (=bonding) thereof, were evaluated through the methods described above, and the results are given in Table 2.

[Surface Tackiness of the Silicone-Based Adhesive Sheets]

Test bodies were manufactured by adhering the silicone-based adhesive sheets (20 mm×20 mm) onto glass (25 mm×75 mm) using double-sided tape for silicone (5302A, manufactured by Nitto Denko). A stainless steel probe with a diameter of 8 mm of a texture analyzer was lowered at a rate of 0.01 mm/s in respect to the sheet surface, and after applying a load of 50 gf, the load was held for 0.5 seconds, after which the probe was raised at a rate of 0.5 mm/s. The stress applied to the probe when raising was measured. Those wherein a maximum value was produced during measurement were defined as "Has maximum value," and those wherein no maximum value was produced were defined as "No maximum value," and the maximum value for those wherein a value is produced during measurement was defined as the tackiness (go. Note that for those siliconic adhesive sheets that had maximum values, all of the adhesive sheets had interfacial delamination from the probe, and did not produce the residual paste that would accompany cohesive fracturing of the adhesive layer.

[Silicon Chip Temporary Securing Performance Test]

2 mm-square silicon chips (with a thickness of 625 µm) were placed onto the silicone-based adhesive sheets that were affixed to glass and a load of 50 gf was applied for 0.5 seconds at 25° C. using a die attached press. The units were then dropped naturally from a vertical height of 100 mm within five minutes thereafter. Those wherein the silicon chips became detached from the silicone-based adhesive sheets surface were scored as x, and those wherein they remained secured to the sheet were scored as ○. Moreover, the silicon chips that remained held on the sheet were easily removed through interfacial delamination using stainless steel tweezers.

[Adhesiveness of Silicone-based Adhesive Sheet]

After adhering a silicone-based adhesive sheet (5 mm×20 mm) onto a silicon wafer (30 mm×30 mm), heating was carried out for five minutes at 130° C. in a die press at 3 kgf, to manufacture test bodies by bonding the film to the substrate. Through peeling the silicone-based adhesive sheets in these test bodies using stainless steel tweezers, the adhesive of the films, in respect to the substrate, were evaluated using the following standards:

○: Paste residual accompanying cohesive fracturing of the adhesive layer was produced on more than half of the adhered surface when peeling the adhered surface after heating.

X: Delamination was at the interface with the adhered object, without cohesive fracturing of the adhesive layer, with the exception of a trivial transferred component, on the adhesive surface when the adhesive surface was peeled after heating.

TABLE 2

|  | Embodiments | | | | | Reference Examples | | | |
| --- | --- | --- | --- | --- | --- | --- | --- | --- | --- |
|  | 1 | 2 | 3 | 4 | 5 | 1 | 2 | 3 | 4 |
| Silicone Film Surface Tackiness | | | | | | | | | |
| Had maximum value? | Yes | Yes | Yes | Yes | Yes | No | No | Yes | Yes |
| Tackiness (gf) | 199 | 172 | 211 | 125 | 346 | 0.2 | 0.2 | 794 | 480 |
| Silicon Chip Temporary Securing Performance Test | | | | | | | | | |
| Temporary securing performance | ○ | ○ | ○ | ○ | ○ | x | x | ○ | ○ |
| Silicone Film Adhesiveness | | | | | | | | | |
| Adhesion after heating for five minutes at 130° C. | ○ | ○ | ○ | ○ | ○ | x | x | x | x |

[Conclusion]

As can be appreciated from the test results for Embodiments 1 through 5 and Reference Examples 1 through 2, the silicone-based adhesive sheets that exhibited behavior wherein the delamination mode in the surface tackiness performance testing was interfacial delamination, and had a maximum value, also had superior temporary securing performance for silicon chips and had the property of expressing permanent bonding, after heating at heating conditions of no more than three hours in a range of between 100 and 200° C. On their hand, while, as in Reference Examples 3 and 4, the silicone adhesive agents exhibited good temporary securing performance, they did not exhibit permanent adhesion after heating, as in the silicone-based adhesive sheet according to the present application, so they cannot improve the manufacturing efficiency for small high-precision semiconductor devices such as MEMS devices. Moreover, in Reference Examples 1 and 2, the surface tackiness was inadequate, and thus would be difficult to use for temporarily securing or temporary placement of silicon chips.

The invention claimed is:

1. A silicone-based adhesive sheet, wherein the silicone-based adhesive sheet is a cross-linked material of a cross-linkable silicone composition comprising:
   (A) an organopolysiloxane that includes at least two silicon atom-bonded alkenyl groups in a single molecule;
   (B) an organopolysiloxane that includes at least two silicon-bonded hydrogen atoms in a single molecule;
   (C) at least one adhesion promoting agent; and
   (D) a hydrosilylation reaction catalyst; and
      wherein prior to cure of the cross-linkable silicone composition, the organopolysiloxane (A) has an initial content of low molecular weight oligomers selected from the group consisting of octamethyl tetrasiloxane (D4) and decamethyl pentasiloxane (D5), and wherein the initial content is subsequently reduced in, or eliminated from, the cross-linked material; and
      wherein the silicone-based adhesive sheet is subjected to a texture analyzer to lower a stainless steel probe with a diameter of 8 mm at a rate of 0.01 mm/s in respect to any surface of the silicone-based adhesive sheet, to apply a load of 50 gf, followed by raising the probe at a rate of 0.5 mm/s after holding the load for 0.5 seconds, such that the silicone-based adhesive sheet undergoes interfacial delamination from the probe, and the adhesive strength exhibits a maximum value produced during measurement of the stress applied to the probe when raising; and further wherein the surface that exhibited the maximum value for the adhesive strength is further heated for three hours in a range of between 100 and 200° C., wherein the delamination mode of the adhesive surface from another non-adhesive substrate changes to cohesive fracturing, and exhibits permanent adhesion with a maximum value of adhesive strength of no less than 10 gf.

2. The silicone-based adhesive sheet as set forth in claim 1, wherein:
   the thickness of the silicone-based adhesive sheet is in a range of between 5 and 1000 μm.

3. The silicone-based adhesive sheet as set forth in claim 1, wherein:
   the silicone-based adhesive sheet is held between substrates having an atom or group and that has releaseability, and where at least one substrate has an atom or group that has releasability selected from an oxygen atom or a sulfur atom on the surface that contacts the silicone-based adhesive sheet.

4. The silicone-based adhesive sheet as set forth in claim 3, wherein:
   the at least one substrate is a sheet-shaped substrate made from an organic resin, wherein the oxygen atom is an atom for structuring a group that is selected from the group consisting of carbonyl groups, alkoxy groups, ester groups, and ether groups, and the sulfur atom is an atom for structuring a group that is selected from the group consisting of sulfone groups and thioether groups.

5. The silicone-based adhesive sheet as set forth in claim 1, wherein: a semiconductor chip or a wafer for semiconductors is bonded to the silicone-based adhesive sheet.

6. The silicone-based adhesive sheet as set forth in claim 1, wherein prior to cure of the cross-linkable silicone composition, the organopolysiloxane (B) has an initial content of low molecular weight oligomers selected from the group consisting of octamethyl tetrasiloxane (D4) and decamethyl pentasiloxane (D5), and wherein the initial content is subsequently reduced in, or eliminated from, the cross-linked material.

7. The silicone-based adhesive sheet as set forth in claim 1, wherein the cross-linkable silicone composition comprises:
   a mixture of a dimethyl polysiloxane blocked with dimethylvinyl siloxy groups on both ends of the molecular chain and a fumed silica; and
   a copolymer of methyl hydrogen siloxane and dimethyl siloxane blocked with trimethyl siloxy groups on both ends of the molecular chain.

8. The silicone-based adhesive sheet as set forth in claim 7, wherein the mixture is 80 parts by weight of the dimethyl polysiloxane blocked with dimethylvinyl siloxy groups on both ends of the molecular chain and 20 parts by weight of the fumed silica.

9. The silicone-based adhesive sheet as set forth in claim 8, wherein the dimethyl polysiloxane blocked with dimethylvinyl siloxy groups on both ends of the molecular chain has a viscosity of 2,000 mPa·s at 25° C. and the copolymer of methyl hydrogen siloxane and dimethyl siloxane blocked with trimethyl siloxy groups on both ends of the molecular chain has a viscosity of 60 mPa·s at 25° C.

10. A layered body that includes the silicone-based adhesive sheet as set forth in claim 1.

11. The layered body as set forth in claim 10, being a die attach film for a semiconductor chip or for a wafer for semiconductors.

12. The layered body as set forth in claim 11, having a structure wherein the semiconductor chip or the wafer for semiconductors is disposed on a substrate with the silicone-based adhesive sheet interposed therebetween.

13. A semiconductor device having a structure wherein a semiconductor chip or a wafer for a semiconductor is secured on the substrate through a cured material of the silicone-based adhesive sheet of claim 1.

14. The semiconductor device as set forth in claim 13, being a micro-electromechanical system (MEMS) device.

15. A method for manufacturing a semiconductor, the method comprising the following steps:
   1) layering the silicone-based adhesive sheet set forth in claim 1 on the back face of a wafer for a semiconductor;
   2) forming individual pieces through dicing the layered body obtained in Step 1);
   3) arranging, on a semiconductor substrate, with the surface of the silicone-based adhesive sheet interposed therebetween, the pieces of the wafer for the semiconductor, obtained in Step 2); and
   4) heating, in a range of between 50 and 200° C., the structural unit, produced in Step 3), wherein the individual pieces of the wafer for the semiconductor are disposed on the semiconductor substrate, with the surface of the silicone-based adhesive sheet interposed therebetween, to bond the pieces of the wafer for the semiconductor onto the top of the semiconductor substrate through the silicone-based adhesive sheet.

16. The method for manufacturing a semiconductor device as set forth in claim 15, wherein:
   the semiconductor device is a micro electro mechanical system (MEMS) device.

17. A method for manufacturing a semiconductor device, the method comprising the following steps:
   1) dividing the silicone-based adhesive sheet set forth in claim 1 into individual pieces of a size that approximates that of a semiconductor chip;
   2) disposing, on a semiconductor substrate, the silicone-based adhesive sheet that has been divided into individual pieces in Step 1);
   3) disposing a semiconductor chip onto the silicone-based adhesive sheet that has been divided into individual pieces, disposed on the semiconductor substrate in Step 2); and
   4) heating, in a range of between 50 and 200° C., the structural unit, obtained in Step 3), wherein a semiconductor chip is disposed on the semiconductor substrate, with the silicone-based adhesive sheet interposed therebetween, to bond the semiconductor chip onto the top of the semiconductor substrate through the silicone-based adhesive sheet.

18. The method for manufacturing a semiconductor device as set forth in claim 17, wherein:
   the semiconductor device is a micro electro mechanical system (MEMS) device.

* * * * *